United States Patent [19]
Hamilton et al.

[11] Patent Number: 5,998,240
[45] Date of Patent: Dec. 7, 1999

[54] METHOD OF EXTRACTING HEAT FROM A SEMICONDUCTOR BODY AND FORMING MICROCHANNELS THEREIN

[75] Inventors: Robin E. Hamilton, Millersville; Paul G. Kennedy, Grasonville; John Ostop, Severna Park; Martin L. Baker, Sykesville; Gregory A. Arlow, Eldersburg; John C. Golombeck, Gambrills, all of Md.; Thomas J. Fagan, Jr., Pittsburgh, Pa.

[73] Assignee: Northrop Grumman Corporation, Los Angeles, Calif.

[21] Appl. No.: 09/071,776

[22] Filed: May 4, 1998

Related U.S. Application Data

[62] Division of application No. 08/681,207, Jul. 22, 1996, Pat. No. 5,801,442.

[51] Int. Cl.⁶ .................................................. H01L 21/44
[52] U.S. Cl. .......................................... 438/122; 257/714
[58] Field of Search ........................... 438/122; 165/80.5, 165/185; 257/714, 721, 706

[56] References Cited

U.S. PATENT DOCUMENTS

| | | | |
|---|---|---|---|
| 4,450,472 | 5/1984 | Tuckerman et al. | 257/714 |
| 4,758,926 | 7/1988 | Herrell et al. | 257/714 |
| 4,771,017 | 9/1988 | Tobin et al. . | |
| 4,894,709 | 1/1990 | Phillips et al. | 257/714 |
| 5,051,814 | 9/1991 | Paal | 257/714 |
| 5,218,515 | 6/1993 | Bernhardt | 257/714 |
| 5,251,100 | 10/1993 | Fujita et al. | 257/714 |
| 5,293,070 | 3/1994 | Burgess et al. . | |
| 5,453,641 | 9/1995 | Mundinger et al. . | |

FOREIGN PATENT DOCUMENTS 0368743   5/1990   European Pat. Off. .

OTHER PUBLICATIONS

A. W. Morse, P. M. Esker, S. Siram, J. J. Hawkins, L. S. Chen, J. A. Ostop, T. J. Smith, C. D. Davis, R. R. Barron, R. C. Clarke, R. R. Siergiej, C. D. Brandt, "Recent Application of Silicon Carbide to High Power Microwave", IEEE MTT–S Digest, 1977.

Patent Abstracts of Japan, Ito Takao, Aug. 16, 1986.

Abstract No. 485, Luchinin, V. et al, Feb. 1989, p. 706.

IBM Technical Disclosure Bulletin, 30 (1987) Dec., No. 7, Armonk, NY,USA,, p. 203.

*Primary Examiner*—Chandra Chaudhari
*Assistant Examiner*—Martin Sulsky

[57] ABSTRACT

Cooling of densely packaged semiconductor devices is achieved by microchannels which extract heat by forced convection and the use of fluid coolant located as close as possible to the heat source. The microchannels maximize heat sink surface area and provides improved heat transfer coefficients, thereby allowing a higher power density of semiconductor devices without increasing junction temperature or decreasing reliability. In its preferred embodiment, a plurality of microchannels are formed directly in the substrate portion of a silicon or silicon carbide chip or die mounted on a ground plane element of a circuit board and where a liquid coolant is fed to and from the microchannels through the ground plane. The microchannels comprise a plurality of closed-ended slots or grooves of generally rectangular cross section. Fabrication methods include deposition and etching, lift-off processing, micromachining and laser cutting techniques.

18 Claims, 9 Drawing Sheets

METHOD OF EXTRACTING HEAT FROM A SEMICONDUCTOR BODY AND FORMING MICROCHANNELS THEREIN

This application is a divisional of application Ser. No. 08/681,207, filed on Jul. 22, 1996, now U.S. Pat. No. 5,801,442, the entire contents of which are hereby incorporated by reference.

BACKGROUND OF THE INVENTION

1. Field of the Invention

This invention relates to convection cooling of high power semiconductor devices and more particularly to microchannel cooling of semiconductor devices formed on a chip of semiconductor material including silicon and silicon carbide.

2. Description of the Prior Art

As the state of the art of semiconductor technology advances and more particularly to those types of devices which are known as power semiconductor devices, and the circuitry associated therewith, there is a continued demand that such devices operate faster and handle more power, while being ever smaller and lower in cost. The semiconductor industry has responded with the development of integrated circuit chips including thereon a large number of transistor devices such as bipolar transistors including power switching devices such as insulated gate bipolar transistors which are particularly applicable for use in medium to high power (1 to 100 kW or more) power converters. Moreover, these devices are currently being incorporated in densely packaged structures that can handle kilowatts of power.

The greatest limitation in the design of such low cost, light weight, high power devices is providing reliable cooling of the densely packaged components. Current state of the art electronic packaging techniques typically utilize redundant parts and excess substrate boundary regions as well as operating the electronics at less than their rated values. For example, in transmitters, silicon RF transistors are typically operated below their power output capability and spaced apart from one another by relatively large separation distances in order to keep them cooled to standardized operating temperatures. The maximum device junction temperature of a silicon bipolar transistor, as dictated by system reliability studies, is normally between 125 and 135° C. The same techniques apply to power switching devices.

More recently, the use of silicon as substrates is being replaced by the use of silicon carbide which can tolerate increased operating temperatures. These devices, however, are still limited internally by known power density and thermal considerations. In conventionally cooled power semiconductors, moreover, the heat generated in a silicon substrate is conducted through several layers of material to an air or liquid cooled heat sink.

SUMMARY

Accordingly, it is a primary object of the present invention to provide an improvement in the extraction of heat from electronic components.

It is another object of the invention to provide an improvement in the cooling of semiconductor devices.

It is a further object of the invention to provide an improvement in the cooling of power semiconductor devices which are utilized in densely packaged configurations.

It is yet another object of the invention to provide an improvement in densely packaged semiconductor by convection cooling.

Briefly, the foregoing objects are achieved by microchannel cooling of densely packaged semiconductor devices which extract heat by forced convection and the use of dense fluids in very small channels located as close as possible to the heat source. This maximizes heat sink surface area and provides improved heat transfer coefficients, thereby allowing a higher power density of semiconductor devices without increasing junction temperature or decreasing reliability. In its preferred embodiment, a plurality of microchannels are formed directly in the substrate portion or die of a silicon or silicon carbide chip mounted on a ground plane element of a circuit board and where a liquid coolant is fed to and from the microchannels through the ground plane. The microchannels comprise a plurality of closed-ended passages of generally rectangular cross section. Fabrication methods include deposition and etching, lift-off processing, micromachining and laser cutting techniques.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

This invention is directed to the concept of the inclusion of a plurality of closed-ended convection cooling microchannels formed directly in the semiconductor chip, also referred to herein as a die, comprised of silicon or silicon carbide on which are formed a plurality of high power semiconductor devices such as bipolar transistors used for RF amplifier and insulated gate bipolar transistors and diodes used in connection with switching applications such as power converters.

Figure 1:
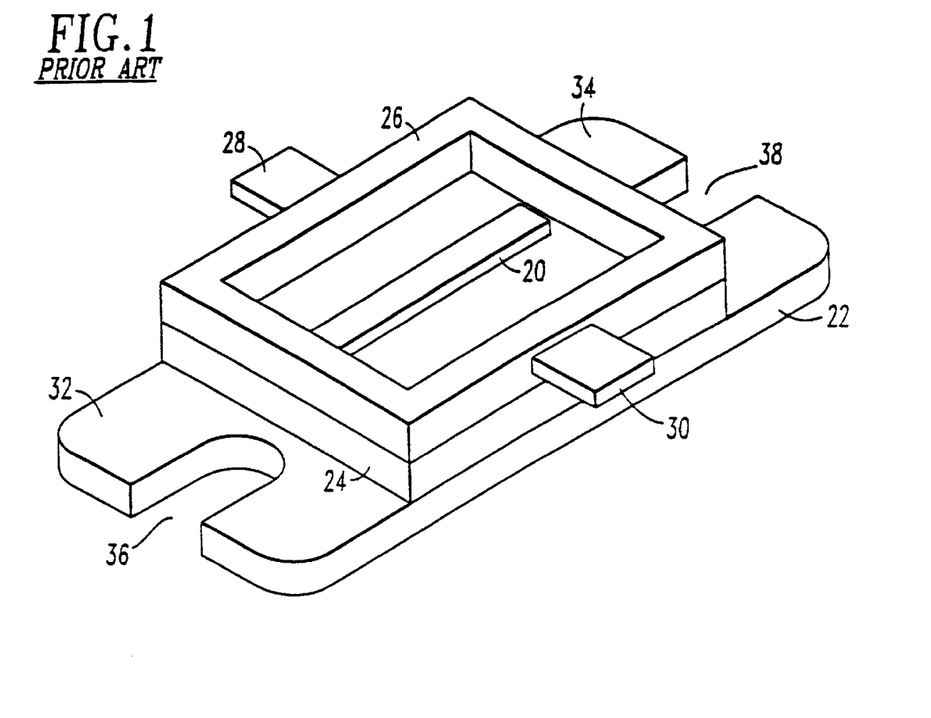
FIG. 1 is a perspective view of a silicon bipolar transistor package in accordance with the known prior art.
Figure 2A:
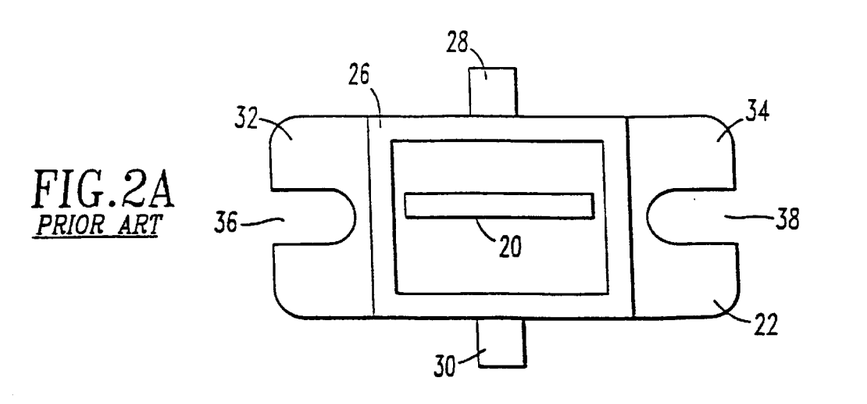
FIG. 2A is a top plan elevational view of the bipolar transistor package shown in FIG. 1.
Figure 2B:
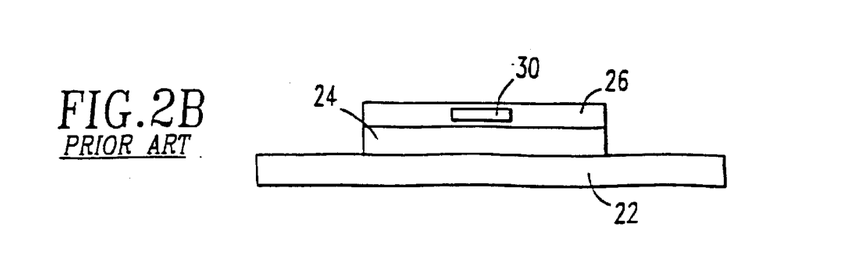
FIG. 2B is a front elevational view of the bipolar transistor package shown in FIG. 1.
Figure 3:
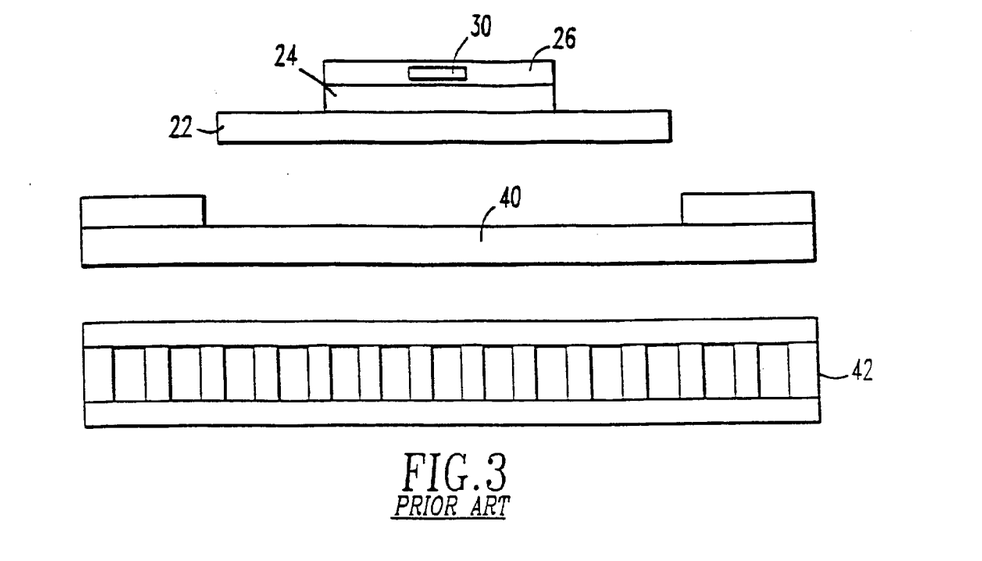
FIG. 3 is an exploded front elevational view of the bipolar transistor package shown in FIG. 1 and its associated ground plane and heat sink therefor in accordance with the known prior art.

Referring now to the drawings and more particularly to FIGS. 1 through 3, shown therein is a conventional high power transistor package including a plurality of RF transistors distributed across the top of a silicon or silicon carbide die identified by reference numeral 20 and typically having a dimension of 0.35 in.×0.035 in.×0.004 in.

The chip/die 20 is located in a package including a nickel plated copper-tungsten flange 22 on which is located a beryllium oxide (BeO) substrate 24 which is nickel (Ni) plated and screen printed with a suitable metal pattern such as molybdenum-manganese ($M_o/M_n$) alloy. The substrate 24 supports the chip/die 20. On top of the substrate 24 is located an aluminum oxide ($Al_2O_3$) window frame 26 and through which a pair of beam leads 28 and 30 project and which couple to leads, not shown, connected to the transistor devices, not shown, formed on the die 20. The flange 22 additionally includes outwardly extending end portions 32 and 34 for connection to external circuitry, not shown, via a pair of U-shaped slots 36 and 38. The flange 22, the substrate 24, the window frame 26 and the leads 28 and 30, are brazed together in one operation using a gold/copper (Ag/Cu) alloy braze which is then gold (Ag) plated to provide a finalized packages. After the die 20 is attached, the semiconductor devices are wire bonded using a gold wedge bonder. A covar lid, not shown, is normally attached to the ceramic window frame 26 to form a hermetically sealed package.

With such a structure, solid state transmitter designers need only to bolt the device to a ground plane element 40 (FIG. 3) which may comprise part of a circuit board or another substrate. The element 40 is then bolted to a separate air or liquid cooled heat exchanger shown by reference numeral 42.

Where the number of semiconductor devices on the silicon chip/die comprises, for example, 100 or more silicon bipolar transistors operating at RF frequencies, a large amount of concentrated waste heat is generated which must be dissipated by conduction through several lossy layers and interfaces both within the package and through the ground plane 40 and the heat exchanger 42. Although this packaging approach has been utilized in the past due to its simplicity and low cost, advancement in high power device designs has pushed the requirement for efficient thermal designs beyond conventional packing schemes including that shown in FIGS. 1–3.

Several design features dictate the thermal properties of these devices. These include the coolant properties and flow rate, the heat exchanger efficiency, the device's substrate interface and the internal device temperature rise. However, coolant type, flow rate and inlet temperatures are often dictated by operating platforms or customer specifications. In addition, a dramatic improvement in a finned type heat exchanger without further pushing flow rate and pressure drop, has not been perfected. The thermal interface between the transistor flange and the substrate ground plane may be improved with solder or conductive epoxy. Unfortunately, this adds considerable system cost in rework and retrofitting. However, up to now, great thermal or electrical efficiency improvements in the transistor package have elluded transistor designers.

Turning attention to the subject invention, thermal improvements can be realized by replacing silicon with silicon carbide. Silicon carbide material is more than a 3 to 1 better thermal conductor than silicon. In conjunction with circuit layout refinements, the thermal impedance within an RF transistor package is decreased by approximately 37%. In addition, silicon carbide permits increased power densities over silicon by offering superior voltage and current performance, thereby enabling higher density circuits that can operate over a wider temperature range. Silicon carbide transistors can operate reliably up to 200° C. junction temperature. This increases the allowable temperature A between the ambient and the transistor junction by 75° C., thus permitting considerably more heat to be dissipated utilizing conventional packaging and heat removal schemes. With silicon carbide, the maximum heat dissipation of an RF transistor can be increased as much as 2.5 times.

This now leads to a consideration of the preferred embodiments of the invention and which include microchannel heat sink geometries which are fabricated directly in the active device portions of the chip or die on which a plurality of identical semiconductor devices are fabricated so that a liquid convection coolant is brought as close as possible to the heat source, thus eliminating the inefficient thermal gradients through the device, circuit board and heat exchanger.

Figure 4A:
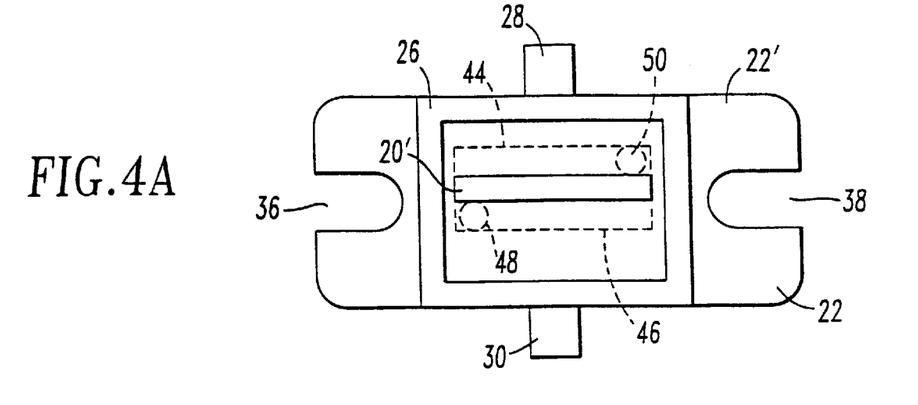
FIG. 4A is a top plan or elevational view of a silicon bipolar transistor package in accordance with a first embodiment of the subject invention.
Figure 4B:
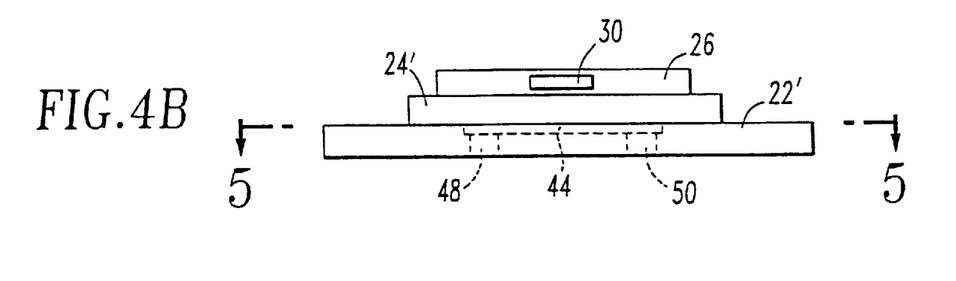
FIG. 4B is a front elevational view of the embodiment shown in FIG. 4A.
Figure 4C:
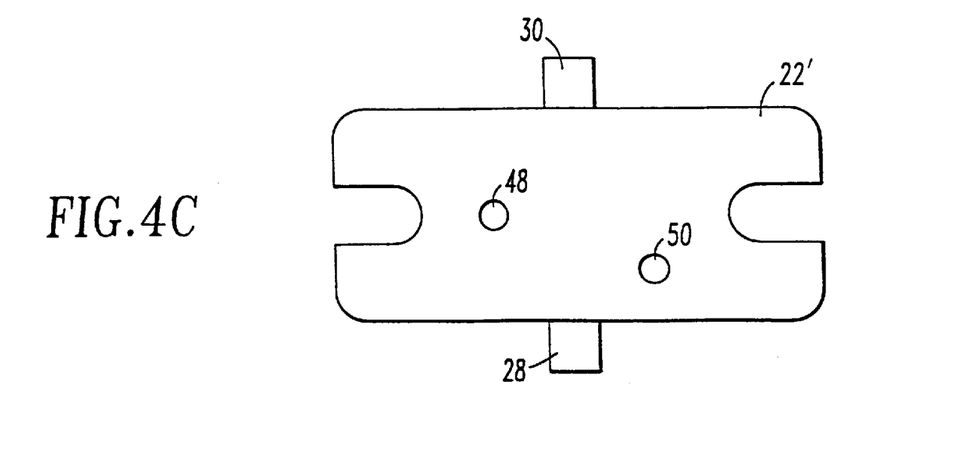
FIG. 4C is a bottom elevational view of the embodiment shown in FIG. 4A.
Figure 5A:
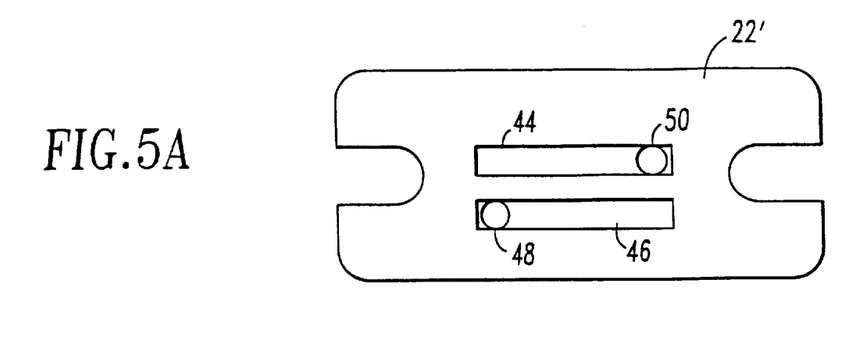
FIG. 5A is a sectional view of the embodiment shown in FIG. 4B taken along the lines 5—5 thereof.
Figure 5B:
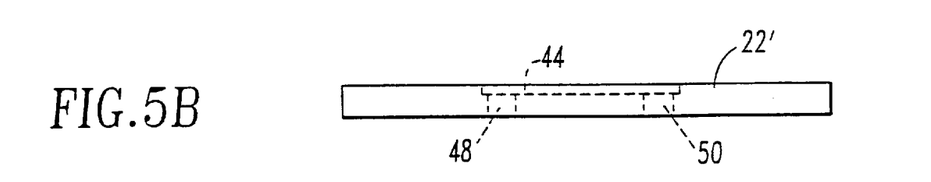
FIG. 5B is a front edge elevational view of the member shown in FIG. 5A.
Figure 8:
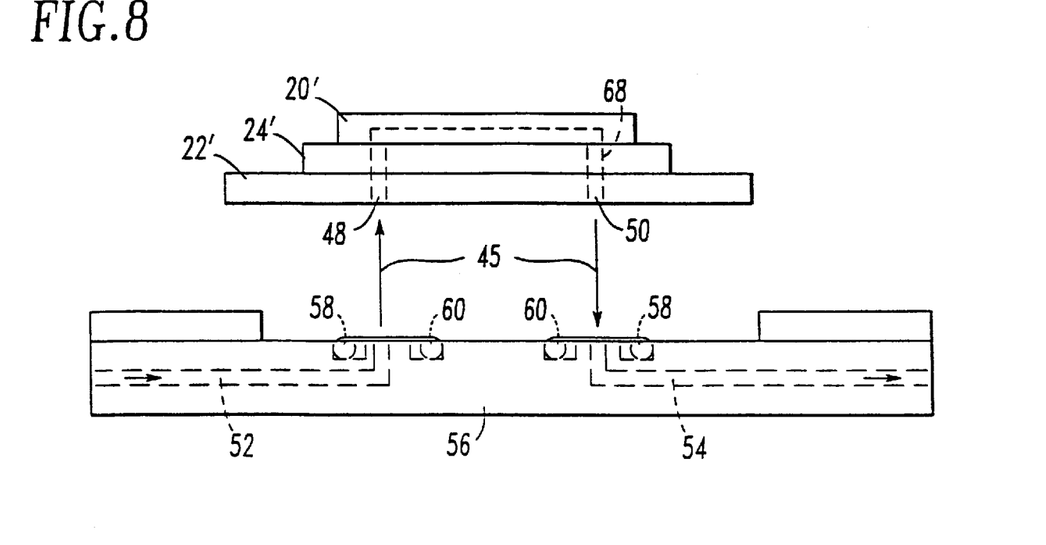
FIG. 8 is an exploded view of a front elevational view of the embodiment of the invention shown in FIGS. 4A–4C mounted on a ground plane including coolant ducts formed therein.

Referring now to FIGS. 4 through 8, which is directed to a first embodiment of the invention, FIGS. 4A–4C depict a microchannel cooled silicon bipolar transistor package including a flange 22', the details of which are further shown in FIGS. 5A–5B, including a pair of elongated rectangular recesses 44 and 46 which are spaced relatively close together in mutual parallel alignment. The recesses 46 and 48 comprise coolant manifolds for coolant coupled thereto via an inlet port 48 located at one end of manifold 46 and an output port 50 located at an opposite end of the manifold 44. As shown in FIG. 8, a liquid coolant 45 is coupled to and from the ports 48 and 50 by means of coolant ducts 52 and 54 formed in a ground plane member 56. A pair of O-rings 58 and 60 act as seals for the ducts 52 and 54 coupled to the input and output ports 48 and 50.

Figure 6:
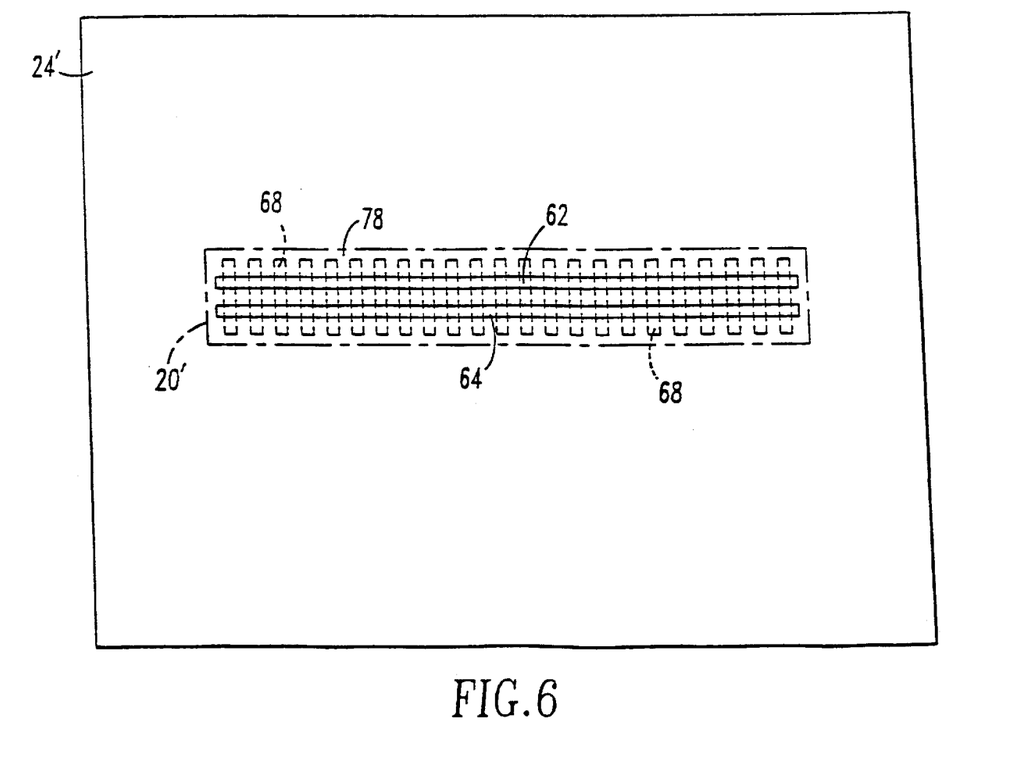
FIG. 6 is an enlarged top elevational view of the ceramic substrate included in the embodiment of the invention shown in FIGS. 4A and 4B.

Contiguous with the top of the flange 22' is a substrate member 24' which is shown by the top elevational view at FIG. 6. As shown, the substrate 24' includes a pair of relatively narrow coolant manifold slots 62 and 64 which when the substrate 24' is in place, straddle the coolant manifolds 44 and 46 of the flange 22' lengthwise and thus are coupled thereto along their length such that, for example, slot 62 extends over the manifold 44, while the slot 64 extends over the manifold 46. A silicon bipolar transistor chip/die 20', the details of which are shown in FIG. 7, is positioned over the two manifold slots 62 and 64 so that the bottom surface 65 of the chip 20' is fluidly coupled to the manifolds 44 and 46.

Figure 7:
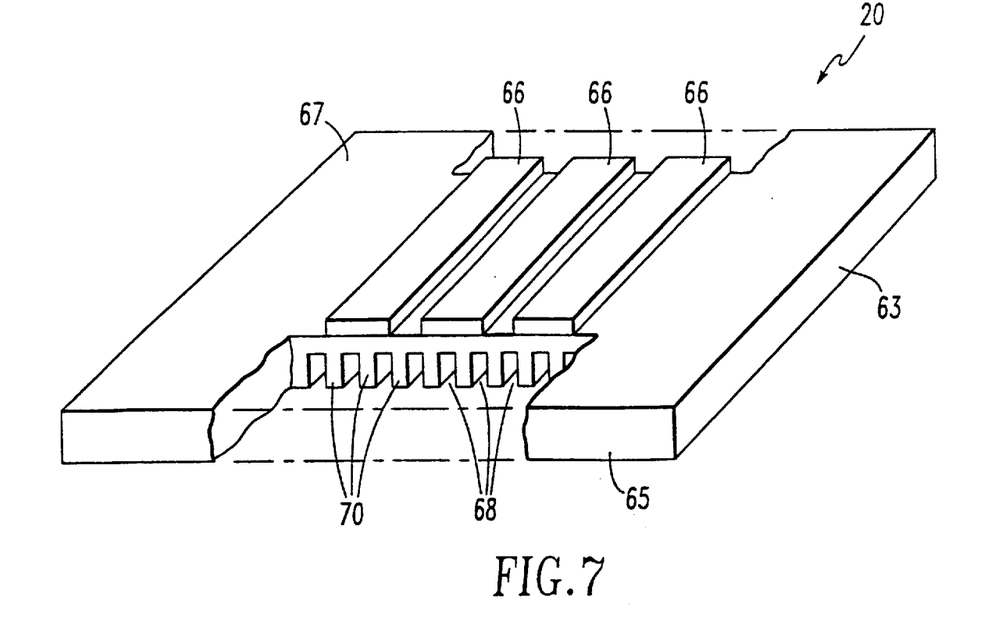
FIG. 7 is a partial cut-away perspective view of the semiconductor chip included in the embodiment shown in FIGS. 4A–4C and being illustrative of a plurality of convection cooling microchannels formed therein.

As to the structure of the chip/die 20' shown in FIG. 7, it is depicted as comprising a relatively long, thin body 63 of semiconductor material of silicon or silicon carbide having a plurality of like or identical semiconductor devices 66 fabricated on the top portion 67 thereof and being arranged in a parallel configuration along the length of the semiconductor body as shown. Along the bottom surface 65 is located a plurality of evenly spaced parallel close-ended microchannels 68 which run transverse to the length of the semiconductor body 63 and in mutual parallel alignment with the semiconductor devices 66. Each microchannel 68 typically comprises a groove 0.004 in. deep by 0.001 in. wide. The length of the microchannels 68 are typically 0.032 in. long, with separation spacings 70 of 0.001 in. When desirable, the microchannel 68 can have a width up to 0.004 in., a depth anywhere from 0.006–0.01 in. and with a spacing up to 0.003 in.

With such a structural arrangement, the heat generated in the bipolar transistors 66 is transferred through solid upper portion of the chip 20' and the fins 70 of the microchannels by conduction and is thereafter transferred to a liquid coolant 45 flowing through the microchannels 68 to and from the manifolds 44 and 46 through the slots 62 and 64. Suitable coolants 45 for the microchannels 68 include water, ethylene glycol water, poly-alpha-olefin, silicate ester, and "Fluorinert" brand liquids, e.g. FC-70, manufactured by the 3M Company.

The use of the very narrow channels or microchannels 68 directly in the chip 20' enhances heat transfer in two ways. First, narrow channels can be closely spaced, providing a large number of fins with a combined surface area much greater than the "foot print" of a conventional heat sink. In addition, the small hydraulic dimensions of the narrow passages provided by the microchannels 68 result in relatively high convection heat transfer coefficients. Since the thermal conductance of a heat sink is proportional to the product of the convective heat transfer coefficient and the surface area, the microchannels 68 permit an increase in the maximum power density for a given operating temperature. The small size of the microchannel heat sink is thus ideal for direct cooling of hot semiconductor components. The thermal efficiencies in large mass typical with traditional heat transferred from a device, through a heat spreader to a heat exchanger are eliminated. Also, the superior performance realized by microchannel heat sinks enables minimal flow of coolant to effectively remove heat from a hot device. When compared to traditional packaging techniques, as shown in the following Table I, the scheme shown in FIGS. 4–7 reduces the thermal impedance between the coolant and the transistor junction of the bipolar transistors 66 shown in FIG. 7, by over 30%, while reducing the coolant flow required by over 75%. These improvements break the thermal barriers limiting state of the art transistor circuit density designs and power output capability.

TABLE I

|  | Silicon Transistor Conventional Liquid Cooling | Silicon Carbide Transistor Conventional Liquid Cooling | Silicon Carbide Transistor Microchannel Cooling |
| --- | --- | --- | --- |
| Device heat dissipation | 31 Watts | 77 Watts | 240 Watts |
| Device junction temp | 125° C. | 200° C. | 165° C. |
| Thermal Impedance: |  |  |  |
| junction-case | 1.28° C./W | 0.81° C./W | — |
| case-substrate interface | 0.44° C./W | 0.44° C./W | — |
| substrate fluid | 0.61° C./W | 0.61° C./W | 0.21° C./W* |
| fluid | 0.08° C./W | 0.08° C./W | 0.27° C./W |
| total: | 2.41° C./W | 1.94° C./W | 0.48° C./W |
| Collant type | 60/40EGW | 60/40EGW | 60/40EGW |
| Inlet fluid temp. | 50° C. | 50° C. | 50° C. |
| Fluid flow rate | 2 gpm | 2 gpm | 0.017 gpm (63 cc/min) |

Figure 9:
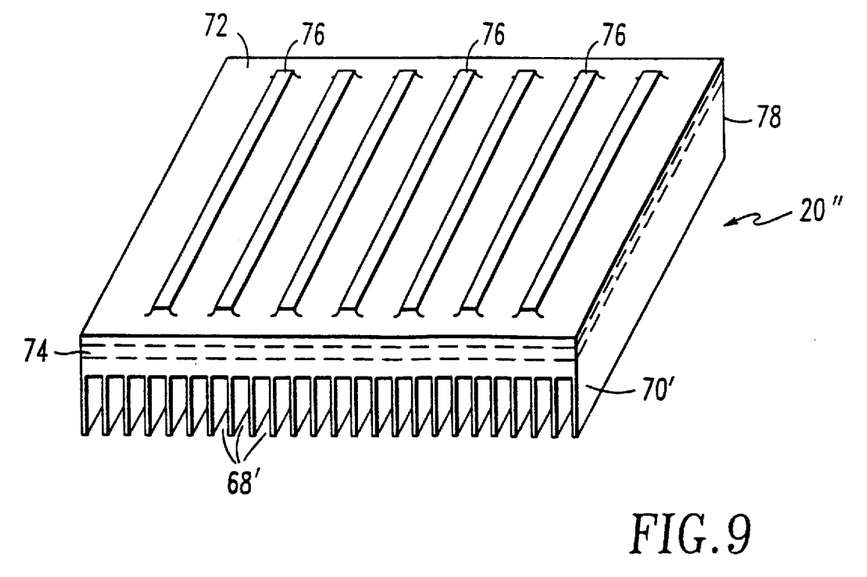
FIG. 9 is a perspective view illustrative of a second embodiment of the invention.
Figure 10:
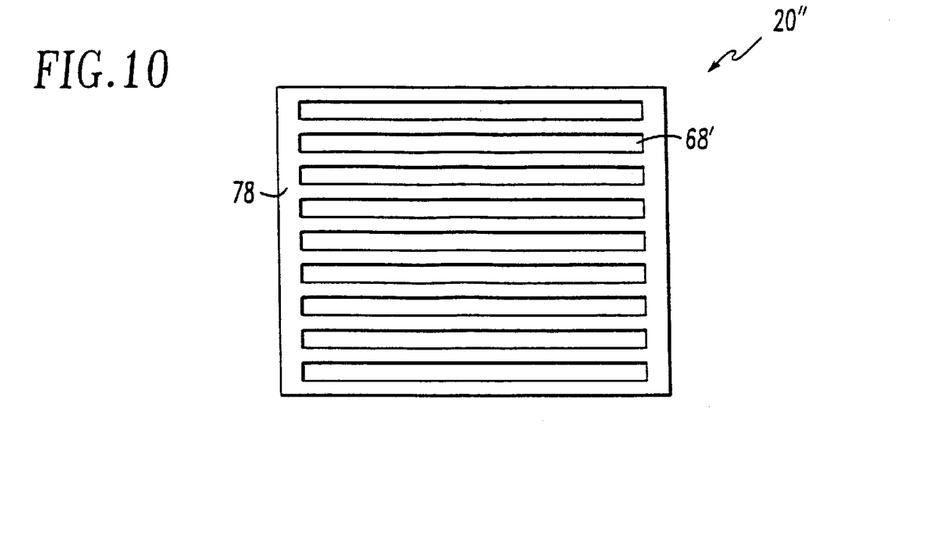
FIG. 10 is a bottom elevational view of a device such as shown in FIG. 9 and being further illustrative of microchannel arrangement formed therein.
Figure 11:
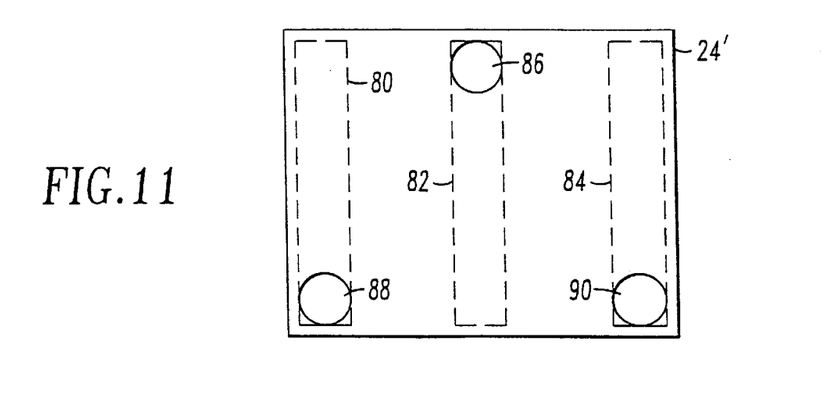
FIG. 11 is a top elevational view of a ceramic frame for the device shown in FIG. 9 and being illustrative of input and output microchannel coolant manifolds with a single input port and two output ports.
Figure 12:
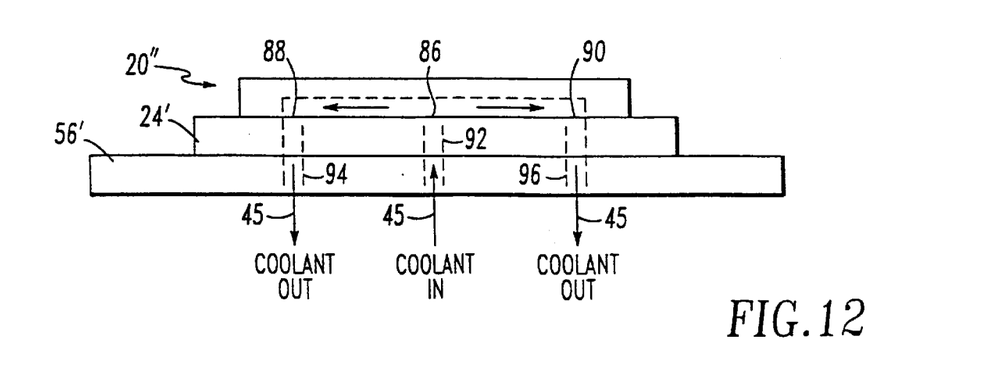
FIG. 12 is a diagram illustrative of the coolant paths for the embodiment shown in FIG. 9.

Referring now to a second embodiment of the invention, reference will now be made to FIGS. 9–11. Shown thereat is an implementation for microchannel cooling of a die of power switching semiconductor devices such as insulated gate bipolar transistors. The semiconductor structure shown in FIG. 9 is shown comprising a silicon chip/die 20" on which is formed a plurality of insulated gate bipolar transistors (IGBT) having a common upper emitter region 72 and underlying common collector region 74 and respective interdigitated gate electrodes 76. Beneath the collector region 74 is a region 78 containing a plurality of microchannels 68', as further shown in FIG. 10, which is intended to depict the fact that the microchannels 68' are close-ended in the same fashion as the microchannels 68 shown in FIG. 7 and that they are also aligned in mutually parallel relationship and of substantially the same size. In the IGBT microchannel structure of FIG. 9, however, the depth of the channel 68' is 0.008 in., while being 0.002 in. wide, with a 0.001 spacing which define a set of relatively thin fins 70' in comparison to their 0.008 in. depth dimension. The length of the channel 68" is limited to the width of the surface of the die 20" which is less than 0.5 in. The die 20" (FIG. 10) sits on a ceramic frame 24' which now includes three generally rectangular coolant manifolds 80, 82 and 84 which are spaced apart as shown in FIG. 11. The middle manifold 82 comprises a coolant input manifold having a coolant inlet port 86 formed at one end, while the two outer manifolds 80 and 84 comprise output manifolds and including a respective coolant outlet ports 88 and 90 at the opposite end from the inlet port 86. The die 20', moreover, is oriented with respect to the ceramic substrate 24' such that the microchannels 68' are orthogonal to the manifolds 80, 82 and 84. The liquid coolant flow direction is further shown in FIG. 12, where both the chip 20" and the ceramic substrate 24' are mounted on a ground plane 56' having a single coolant input duct 92 and two output ducts 94 and 96. Such a configuration operates to keep conduction lengths as short as possible.

Figure 13A:
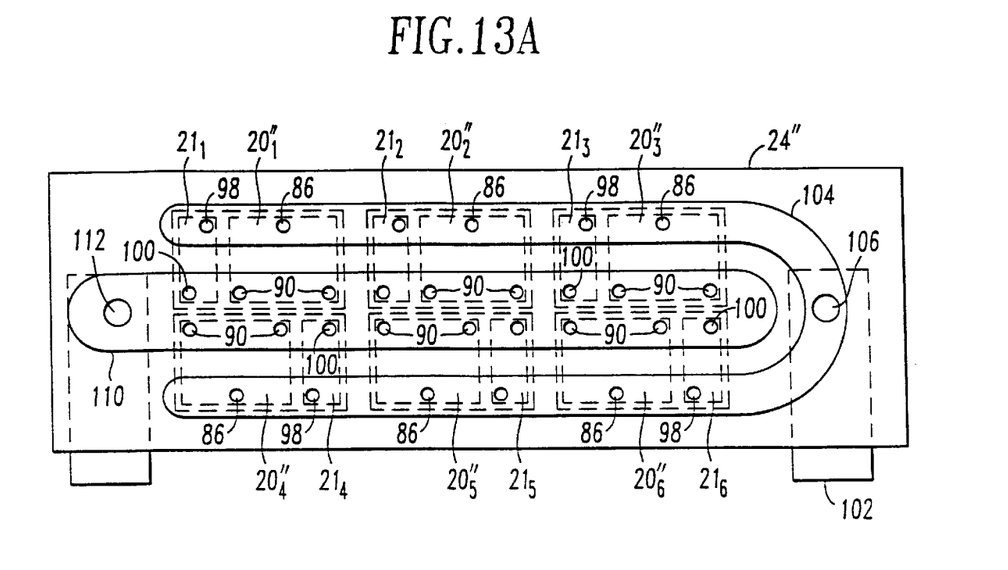
FIG. 13A is a top elevational view of a third embodiment of the subject invention.
Figure 13B:
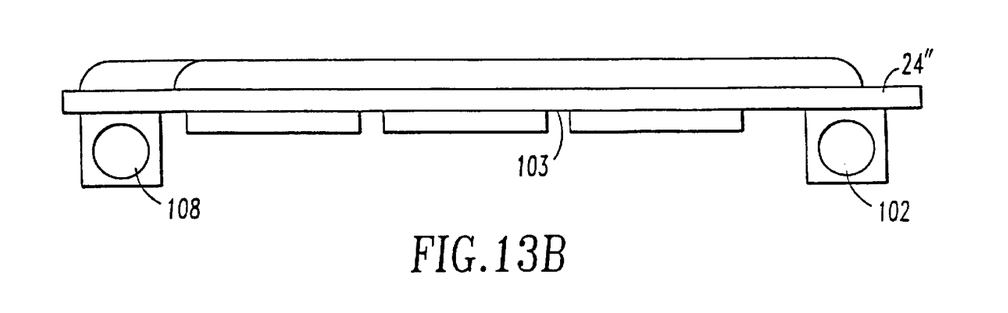
FIG. 13B is a front elevational view of the embodiment shown in FIG. 12A and being illustrative of the fluid input and output ports therefor.

Referring now to FIGS. 13A and 13B, shown thereat is a cooling architecture for a third embodiment of the invention which includes the incorporation of fast, soft recovery back diodes connected across a set of IGBT devices in a three phase IGBT power bridge module which can be used, for example, in electric motor control. As shown in FIG. 13A, six IGBT dies $20_1$" . . . $26_6$" each having single inlet ports 86 and dual outlet ports are positioned next to six back diode dies $21_1 \ldots 21_6$, each including a single inlet port 98 and a single outlet port 100. A single coolant inlet duct 102 is connected at one end to the underside 103 of the ceramic substrate 24". The substrate is also configured to include a U-shaped inlet coolant manifold 104 having an inlet port 106 formed in the curved end portion thereof. A single coolant outlet duct 108 is connected to the underside 103 at the other end of the ceramic substrate 24" where it connects to a single elongated coolant manifold 110 which runs down the center of the substrate 24" between the arms of the inlet manifold 104. An output port 112 connects the coolant outlet manifold 110 to the output duct 108.

The embodiments of the invention thus disclosed having improved heat transfer coefficients permit increased power density with fewer devices, fewer circuits and fewer assemblies when compared to conventionally cooled units delivering the same level of power.

Figure 14:
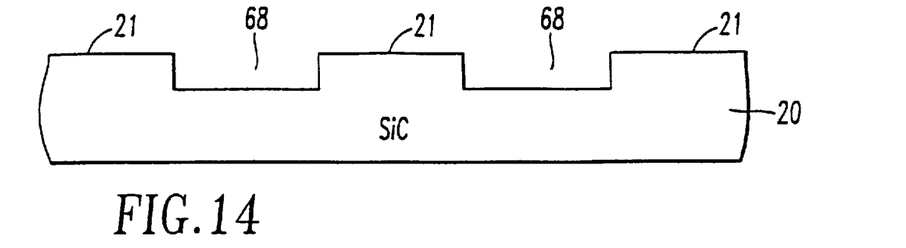
FIG. 14 is a diagram illustrative of a first method for forming microchannels in a silicon carbide device.
Figure 15A:
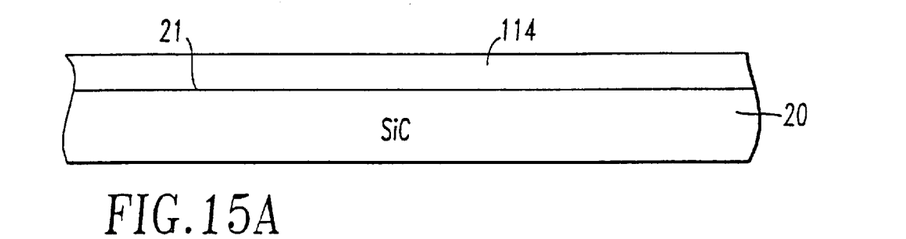
FIGS. 15A–15C are diagrams illustrative of a second method for forming microchannels on silicon carbide.
Figure 15B:
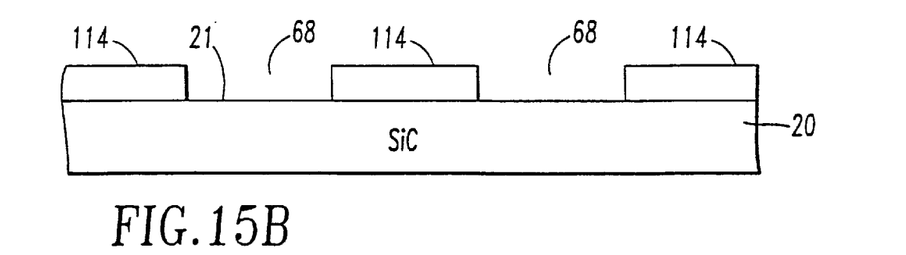
Figure 15C:
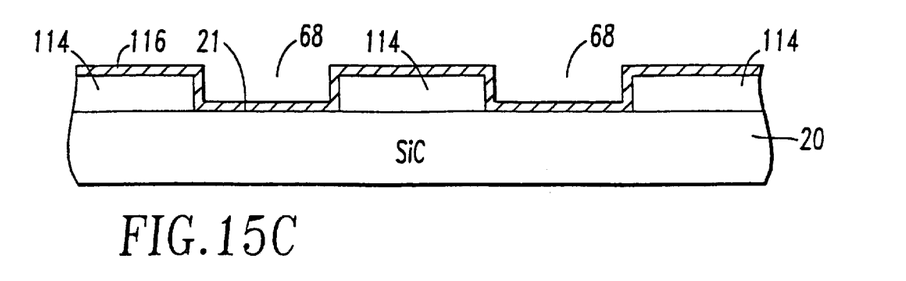
Figure 16A:
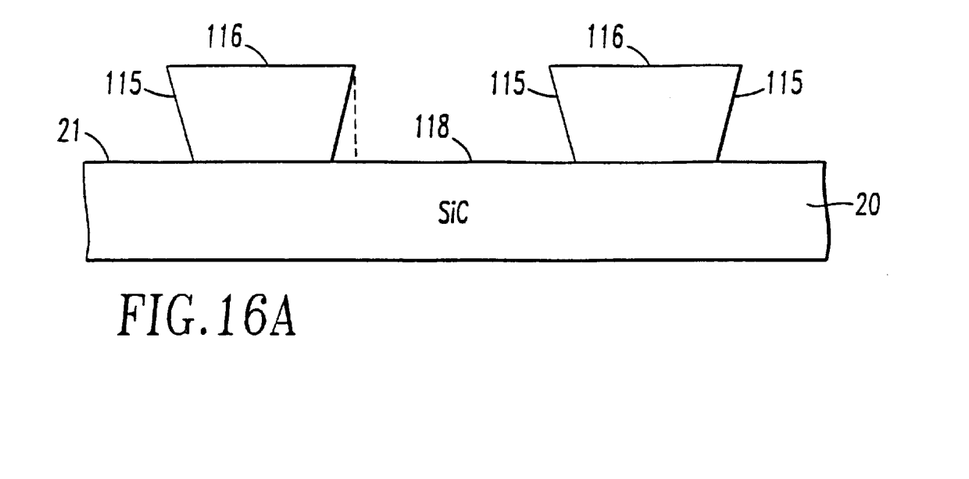
FIGS. 16A–16C are diagrams illustrative of a third method for forming microchannels on silicon carbide.
Figure 16B:
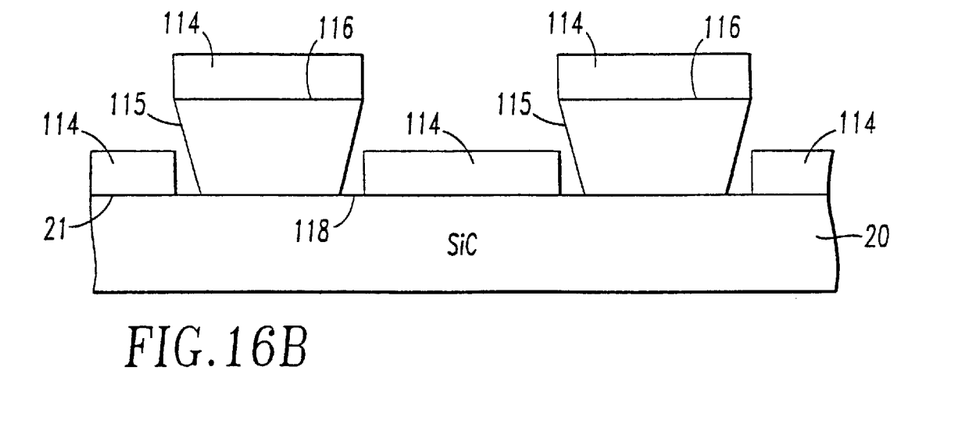
Figure 16C:
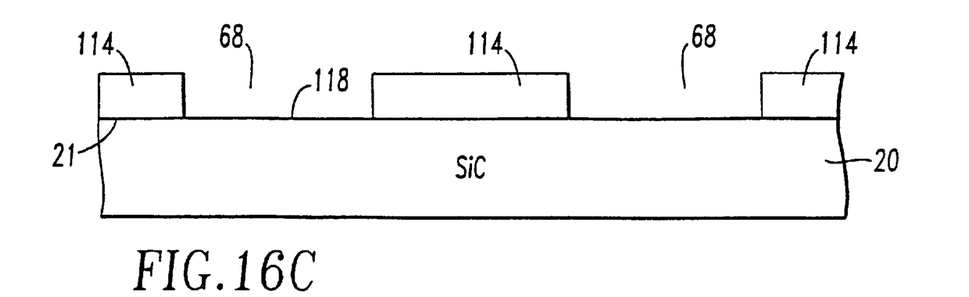

Referring now to FIGS. 14 through 16, shown thereat are three fabrication techniques for forming microchannels 68 in semiconductor substrates and more particularly silicon carbide. As shown in FIG. 14, the simplest way for forming microchannels 68 is simply to use a micromachining process such as saw cutting, into the back of a silicon carbide substrate 20. This technique eliminates any thermal expansion mismatch issues between the silicon carbide and any deposited channel material. The channels can also be formed by using well known laser cutting techniques.

Another approach to the formation of microchannels 68 on a silicon carbide substrate 20 is to utilize a deposition and etching process shown in FIGS. 15A–15C. As shown in FIG. 15A, a layer of semiconductor or metal alloy material 114, with adequate thermal conductivity and suitable thermal expansion, is built up on one side 21 of a wafer 20 using either deposition or plating. Silicon comprises a suitable semiconductor material. A metal candidate is tungsten. Next as shown in FIG. 15B using photolithographic techniques, the material 114 is then etched to form the microchannels 68. Following this and as shown in FIG. 15C, a layer of high conductivity material 116 is then deposited on all surfaces of the microchannel 68 as well as the residual material 114 to produce a heat sink with microchannels 68 formed therein. The material outer layer of material 116 serves two purposes. It provides an increased electrical drain contact area for the present silicon carbide transistor design, and it also improves the wetting of the coolant to the channel walls for improved thermal performance.

The third fabrication technique comprises a lift-off process shown in FIGS. 16A–16C. As depicted in FIG. 16A, a selected type of lift-off material 116, which may be, for example, photoresist, glass or silicon dioxide, is deposited on the top surface 21 of the silicon carbide substrate 20. The material is then etched so that the remaining geometry has a retrograde profile as shown in FIG. 16A, meaning that the bottom of the etch at the surface 118 is wider than at the top. Microchannel material 114 is then deposited over the resultant mesa configuration 115 as shown in FIG. 16B. This causes the deposition of items to fall nearly perpendicular to the surface 118 of the silicon carbide. Microchannels 68 are then formed as shown in FIG. 16C by etching away the lift-off material 116 and the microchannel material 114 deposited thereon.

Thus what has been shown and described is an innovative packaging technique and fabrication process for implementing microchannel cooling which will provide thermal efficiency improvements required for compact, high power transistor and/or integrated circuit designs, particularly circuits formed on silicon and silicon carbide.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

We claim:

1. A method of extracting heat from a solid-state device comprising the steps of:

forming a plurality of microchannel grooves having a relatively thin layer of electrically conductive material on all surfaces thereof, in one region of a semiconductor body comprising a die of silicon or silicon carbide and including a plurality of active semiconductor devices formed in another region of the same said semiconductor body, said grooves being in parallel alignment with said plurality of active semiconductor devices and having a width ranging between about 0.001 in. and about 0.004 in., a depth ranging between about 0.004 in. and about 0.01 in. and having a spacing therebetween ranging between about 0.001 in. and about 0.003 in.;

coupling a source of fluid coolant to and from said microchannel grooves; and, effecting a flow of said coolant through said microchannel grooves to extract, by forced convection, heat generated by said active semiconductor devices.

2. A method according to claim 1 wherein said one region comprises an upper region of said semiconductor body and said another region comprises a lower region of said semiconductor body.

3. A method according to claim 2 and additionally including the step of locating said semiconductor body in a package mounted on a ground plane and wherein said step of coupling includes coupling said source of fluid coolant through said ground plane and into said package.

4. A method according to claim 1 wherein said microchannel grooves comprise mutually parallel close-ended grooves having a channel length ranging between about 0.032 in. and 0.5 in.

5. A method according to claim 4 wherein said plurality of active semiconductor devices comprise a plurality of transistors.

6. A method according to claim 1 wherein said fluid coolant comprises a liquid coolant.

7. A method of forming a plurality of forced convection cooling microchannels on a heat generating silicon carbide device, comprising the steps of:

forming a wafer or substrate of silicon carbide having at least one generally flat planar surface; and micromachining a plurality of elongated close-ended mutually parallel microchannel grooves in said flat planar surface, said grooves having a width ranging between about 0.001 in. and about 0.004 in., a depth ranging between about 0.004 in. and about 0.01 in. and having a spacing therebetween ranging between about 0.001 in. and about 0.003 in; and, forming a thin layer of electrically conductive material on all surfaces of said grooves.

8. A method of forming a plurality of forced convection cooling microchannels on a heat generating silicon carbide device, comprising the steps of:

forming a wafer or substrate of silicon carbide having at least one generally flat planar surface; and forming a layer of microchannel material on said flat planar surface, etching said layer of microchannel material to form a plurality of elongated close-ended mutually parallel microchannel grooves down to said flat planar surface, said grooves having a width ranging between about 0.001 in. and about 0.004 in., a depth ranging between about 0.004 in. and about 0.01 in. and having a spacing therebetween ranging between about 0.001 in. and about 0.003 in.; and, depositing a thin layer of electrically conductive material on all surfaces of said grooves.

9. A method according to claim 8 wherein said step of forming a layer of microchannel material comprises depositing or plating a layer of semiconductor on said flat planar surface.

10. A method according to claim 9 wherein said layer of semiconductor comprises silicon carbide.

11. A method according to claim 8 wherein said step of forming a layer of microchannel material comprises depositing or plating a layer of metal or metal alloy on said flat planar surface.

12. A method according to claim 11 wherein said layer of metal comprises tungsten.

13. A method of forming a plurality of forced convection cooling microchannels on a heat generating silicon carbide device, comprising the steps of:

forming a wafer or substrate of silicon carbide having at least one generally flat planar surface;

depositing a layer of lift-off material on said flat planar surface, etching the layer of lift-off material so as to generate a plurality of elongated mesas having a retrograde profile where the width of said mesas at a lower portion thereof, adjacent said flat planar surface is relatively narrow compared to the top portion thereof;

depositing a layer of microchannel material over said elongated mesas and the space therebetween; and etching away said mesas and the layer of microchannel material deposited thereon, thereby leaving a plurality of elongated close-ended mutually parallel microchannel grooves, said grooves having a width ranging between about 0.001 in. and about 0.004 in., a depth ranging between about 0.004 in. and about 0.01 in. and having a spacing therebetween ranging between about 0.001 in. and about 0.003 in and, forming a thin layer of electrically conductive material on all surfaces of said grooves.

14. A method according to claim 13 wherein said layer of lift-off material is selected from a group of materials including photoresist, glass, and silicon dioxide.

15. A method according to claim 13 wherein said layer of microchannel material comprises semiconductor material.

16. A method according to claim 14 wherein said semiconductor material comprises silicon.

17. A method according to claim 13 wherein said microchannel material comprises metal or a metal alloy.

18. A method according to claim 17 wherein said metal comprises tungsten.

* * * * *